US008614534B2

(12) United States Patent
Martin et al.

(10) Patent No.: US 8,614,534 B2
(45) Date of Patent: Dec. 24, 2013

(54) TRANSDUCER HAVING NATURAL UNIDIRECTIONALITY FOR SURFACE ACOUSTIC WAVES

(75) Inventors: Guenter Martin, Dresden (DE); Manfred Weihnacht, Dippoldiswalde (DE); Sergey Biryukov, Bannewitz (DE); Alexander Darinski, Moscow (RU); Bert Wall, Potsdam (DE)

(73) Assignees: Vectron International GmbH & Co. KG, Teltow (DE); Leibniz-Institut fuer Festkoerper- und Werkstofffforschung Dresden e.V., Dresden (DE)

( * ) Notice: Subject to any disclaimer, the term of this patent is extended or adjusted under 35 U.S.C. 154(b) by 13 days.

(21) Appl. No.: 13/262,874

(22) PCT Filed: Apr. 21, 2010

(86) PCT No.: PCT/EP2010/055291
§ 371 (c)(1),
(2), (4) Date: Oct. 4, 2011

(87) PCT Pub. No.: WO2010/122067
PCT Pub. Date: Oct. 28, 2010

(65) Prior Publication Data
US 2012/0032554 A1 Feb. 9, 2012

(30) Foreign Application Priority Data

Apr. 23, 2009 (DE) .......................... 10 2009 002 604

(51) Int. Cl.
*H03H 9/25* (2006.01)
(52) U.S. Cl.
USPC ................................. 310/313 A; 310/313 R
(58) Field of Classification Search
USPC ........... 310/313, 360, 366, 365; 333/193, 195
IPC ....................................................... H03H 9/25
See application file for complete search history.

(56) References Cited

U.S. PATENT DOCUMENTS

| 5,821,673 A | * | 10/1998 | Pisarevsky et al. | ............ | 310/360 |
| 6,005,325 A | * | 12/1999 | Inoue et al. | ................ | 310/313 A |
| 6,194,809 B1 | | 2/2001 | Takeuchi et al. | | |
| 6,534,897 B2 | * | 3/2003 | Takeuchi et al. | ........... | 310/313 A |
| 2002/0011761 A1 | * | 1/2002 | Takeuchi et al. | ........... | 310/313 B |

OTHER PUBLICATIONS

P. V. Wright, "The natural single-phase unidirectional transducer: A new low-loss SAW transducer," Proc. 1985 IEEE Ultrasonics Symposium, pp. 58-63. (Spec, pp. 3-5).
T. Thorvaldsson and B. P. Abbott, "Low loss SAW filters utilizing the natural single phase unidirectional transducer (NSPUDT)*," Proc. 1990 IEEE Ultrasonics Symposium, pp. 43-48. (Spec, pp. 4-5).
D. P. Morgan, S. Zhgoon, A. Shvetsov, E. Semenova, and V. Semenov, "One-port SAW Resonators using Natural SPUDT Substrates," Proc. 2005 IEEE Ultrasonics Symposium, pp. 446-449. (Spec, pp. 4-5).

* cited by examiner

*Primary Examiner* — Thomas Dougherty
*Assistant Examiner* — Karen B Addison
(74) *Attorney, Agent, or Firm* — Collard & Roe, P.C.

(57) ABSTRACT

A transducer has natural unidirectionality for surface acoustic waves. An interdigital electrode structure is arranged on a piezoelectric crystal substrate and is constructed with interdigital transducers including collecting electrodes and fingers. At least two of the fingers form a transducer cell, which includes at least one excitation center for exciting an electrical potential wave and at least one reflection center for reflecting electrical potential waves. The fingers are oriented perpendicularly to a direction R parallel to a 1- or 3-fold rotational axis of the substrate crystal and the derivative $dv/d\theta = 0$ applies to R, wherein v is the phase velocity of the surface wave and $\theta$ is an angular deviation of the perpendicular to the finger direction from the direction R.

12 Claims, 3 Drawing Sheets

TRANSDUCER HAVING NATURAL UNIDIRECTIONALITY FOR SURFACE ACOUSTIC WAVES

CROSS REFERENCE TO RELATED APPLICATIONS

This application is the National Stage of PCT/EP2010/055291 filed on Apr. 21, 2010, which claims priority under 35 U.S.C. §119 of German Application No. 10 2009 002 604.5 filed on Apr. 23, 2009, the disclosure of which is incorporated by reference. The international application under PCT article 21(2) was not published in English.

TECHNICAL FIELD

The present invention relates to the field of electrical technology/electronics and relates to a transducer having natural unidirectionality for surface acoustic waves. Objects in which the use of the transducer according to the invention is possible and practical are, in particular, sensors, identification components (ID tags), resonators, filters, delay lines, and oscillators, to the extent that their method of functioning is based on surface acoustic waves.

STATE OF THE ART

Transducers having natural unidirectionality for surface acoustic waves are already known; in these, an interdigital electrode structure is disposed on a piezoelectric crystal substrate. In this connection, the interdigital electrode structure is composed of interdigital transducers that consist of collector electrodes and prongs, whereby at least two prongs having different polarity form a transducer cell as the base element of the transducer. Each transducer cell has an excitation center for exciting an electrical potential wave and at least one reflection center for reflecting electrical potential waves.

A prerequisite for the existence of unidirectional properties of interdigital transducer cells is that the distance between the excitation center and the reflection center in one and the same cell amounts to precisely or approximately $\pm\frac{1}{8}$ or $\pm\frac{3}{8}$ of the wavelength, whereby this wavelength corresponds to the quotient of the phase velocity of the surface wave and the frequency at which the transducer emits the maximal surface wave amplitude. Aside from the wave excitation, the reflection of waves is therefore a necessary condition for the existence of unidirectional properties. Excitation center and reflection center mean the excitation center and reflection center of the electrical potential of the surface acoustic wave. If the distance of the excitation center from a reflection center of a cell does not deviate significantly from $\pm\frac{1}{8}$ or $\pm\frac{3}{8}$ of the wavelength, then the natural unidirectionality is referred to as being complete. Otherwise, it is referred to as being incomplete.

In the case of absence of a natural unidirectionality or natural unidirectional properties, the cells contain prongs having different widths, generally having different prong distances—in the case of more than two prongs per cell. Such a cell has an asymmetrical structure, considered in the propagation direction. If a transducer having a symmetrical structure possesses unidirectional properties, one refers to this property as natural unidirectionality. A symmetrical transducer consists, for example, of cells that contain two prongs having the same width and different polarity, and a distance of the prong centers of 0.5 of the wavelength, whereby the cell length amounts to a wavelength.

In a special embodiment (P. V. Wright, "The natural single-phase unidirectional transducer: A new low-loss SAW transducer," Proc. 1985 IEEE Ultrasonics Symposium, pages 58-63, hereinafter also referred to as [1]), the unidirectional properties of transducers on a quartz substrate, which are composed of cells having two fingers having a width of the wavelength (i.e. having fingers of the same width, in each instance) and a gap between them having a width of ¼ of the wavelength, are generated by means of rotating the propagation direction of the surface acoustic waves away from the crystalline X axis. During propagation of the surface acoustic waves in the direction of the X axis, there are no unidirectional properties for the transducer type used. More detailed information concerning a propagation direction of surface acoustic waves having natural unidirectionality can be found in another special embodiment (T. Thorvaldsson and B. P. Abbott, "Low loss SAW filters utilizing the natural single phase unidirectional transducer (NSUDT)," Proc. 1990 IEEE Ultrasonics Symposium, pages 43-48, referred to as [2]). The crystal section of quartz and the propagation direction are determined by the Euler angles (0°, 124°, 25°). This combination is characterized by complete natural unidirectionality. Another example for natural unidirectionality is langasite ($La_3Ga_5SiO_{14}$) having the Euler angles (0°, 138.5°, 26.6°) (D. P. Morgan, S. Zhgoon, A. Shvetsov, E. Semenova, and V. Semenov, "One-port SAW resonators using Natural SPUDT substrates," Proc. 2005 IEEE Ultrasonics Symposium, pages 446-449, referred to as [3]). In this case, the natural unidirectionality is incomplete.

The explanations in the documents [1], [2], and [3] have in common not only the natural unidirectionality, but also the fact that $dv/d\theta \neq 0$ for the propagation directions of the surface acoustic waves as indicated, whereby v is the phase velocity of the surface wave and $\theta$ is an angle deviation of the perpendicular to the prong direction from the propagation direction. From this, the disadvantage results that small errors as the result of variations in the technological parameters during orientation of the electrode structure on the substrate, which are always present, can lead to great errors of the phase velocity of the surface wave and thus of the frequency position of the transducers.

Transducers having natural unidirectionality are also already known, in which interdigital electrode structures are disposed on a piezoelectric langasite substrate (U.S. Pat. No. 6,194,809 B1). The electrode structures consist of collector electrodes and prongs, whereby two prongs form a transducer cell. A particular disadvantage of these components is the small coupling factor of the langasite substrate used, which makes it possible to implement broadband transducer components only at the expense of great insertion loss.

PRESENTATION OF THE INVENTION

The invention is based on the task of finding materials, material sections, and propagation directions for transducers having natural unidirectionality, which result in a low insertion loss even in the base of broadband transducers, and in which the frequency position is not influenced or only influenced slightly by errors in the orientation of the electrode structure on the substrate, despite the unidirectional properties of the transducers.

This task is accomplished by means of the characteristics in the characterizing part of claim 1, in interaction with the characteristics in the preamble. Preferred embodiments of the invention are contained in the dependent claims.

In the transducer according to the invention, an interdigital electrode structure is disposed on a piezoelectric crystal substrate, which is built up from interdigital transducers that consist of collector electrodes and prongs, whereby at least two of the prongs form a transducer cell that has at least one excitation center for exciting an electrical potential wave and at least one reflection center for reflecting electrical potential waves.

According to the invention, the prongs are oriented perpendicular to a direction R, whereby the direction R is directed parallel to a monad or triad axis of rotation of the substrate crystal. In this connection, the derivation $dv/d\theta=0$ holds true for the direction R, where $v$ is the phase velocity of the surface wave and $\theta$ is an angle deviation of the perpendicular to the prong direction from this direction R, whereby, however, the directions perpendicular to the mirror plane of the substrate crystal are excepted. Furthermore, in this connection, the crystal substrate surfaces parallel to a mirror plane of the substrate crystal or perpendicular to a diad, tetrad or hexad axis of rotation of the substrate crystal are supposed to be excepted, for the arrangement of the interdigital electrode structure.

According to another characteristic of the invention, the electrode materials and their layer thicknesses are selected in such a manner that the phase shift $\Phi s$ between the excitation center and a reflection center in each transducer cell, given by the equation $$\sin^2(\Phi_s) = \frac{(\omega_{o2} - \omega_{s2})(\omega_{s2} - \omega_{o1})}{(\omega_{s2} - \omega_{s1})(\omega_{o1} + \omega_{o2} - \omega_{s1} - \omega_{s2})}.$$

lies between 41.4° and 48.6° or between −48.6° and −41.4° or between 131.4° and 138.6° or between −138.6° and −131.4°, whereby $\omega_{s1}$ and $\omega_{s2}$ are the resonance frequencies of a short-circuited transducer, and $\omega_{o1}$ and $\omega_{o2}$ of an open interdigital transducer having an infinite number of prongs, in which prongs, in every transducer cell, the distance of the excitation center from the reflection center is between 0.115 and 0.135 or between −0.135 and −0.115 or between 0.365 and 0.385 or between −0.385 and −0.365 of the quotient of the phase velocity of the surface wave and the frequency at which the transducer emits the maximal surface wave amplitude.

According to the present invention, the excitation center is understood to be the line parallel to the prong edges that is dependent on the geometry of the interdigital electrode structure, the piezoelectric crystal Substrate, and the electrical potentials of the unidirectional transducer, at which the electrical potential wave is excited, which wave is a component of the surface waves generated.

According to the present invention, a reflection center is understood to be the line parallel to the prong edges that is dependent on the geometry of the interdigital electrode structure, the piezoelectric crystal substrate, and the electrical potentials of the unidirectional transducer, at which the electrical potential wave that is excited by the excitation center is reflected, which wave is a component of the reflected surface waves.

The location of the excitation center and that of the reflection center can be determined, for a unidirectional transducer, in known manner, using commercially available computer programs, from:
  the type of the piezoelectric crystal substrate on which the interdigital transducers are disposed,
  the crystal substrate section that is present,
  the orientation of the prong edges of the interdigital transducers relative to the axes of the piezoelectric crystal substrate,
  the prong positions in the interdigital transducers,
  the prong widths and the prong thicknesses of the interdigital transducers,
  the material of which the prongs of the interdigital transducers consist,
  the amount of the electrical potential that is present at the prongs of the interdigital transducers.

It is very time-consuming, for practical purposes, if not actually impossible, to find solutions for transducer cells having predetermined property parameters by means of varying the prong widths and positions by hand. However, computer-supported optimization methods are available as aids. For example, corresponding optimization functions are available on the market in the MATLAB programming language. An analysis program that calculates the property parameters numerically is required for calculating the property parameters of the structure of the transducer cells that is present at the current step of optimization, in each instance. For this reason, no analytical relationships between the property parameters and the cell structure can be indicated, either. Such analysis programs can be purchased commercially.

It is particularly surprising that transducers having natural unidirectional properties are even possible if the main propagation direction for surface acoustic waves having a triad axis of rotation is a highly symmetrical direction of the substrate crystal, for which $dv/d\theta=0$ also applies. This possibility of designing transducers having natural unidirectional properties has not been utilized up to now.

In the following, advantageous and practical embodiments of the invention will be described.

The electrodes can be structured as a layer system, whereby the layer system can also contain only one layer.

A transducer cell can contain two prongs having the same width and different polarity, with the distance between the prong centers amounting to 0.5 of the quotient of the phase velocity of the surface wave and the frequency at which the transducer emits the maximal surface wave amplitude.

However, a transducer cell can also contain two prongs having different widths, if the electrode materials and their layer thicknesses are selected in such a manner that in a transducer cell that contains two prongs having the same width and different polarity, the distance between which amounts to 0.5 of the quotient of the phase velocity of the surface wave and the frequency at which the transducer emits the maximal surface wave amplitude, the distance of the excitation center from a reflection center lies outside of the ranges 0.115 to 0.135 and −0.135 to −0.115 and 0.365 to 0.385 and −0.385 to −0.365 of the quotient of the phase velocity of the surface wave and the frequency at which the transducer emits the maximal surface wave amplitude. This is particularly advantageous if, for example, a layer system that requires an overly great layer thickness of one of the electrode materials is used as the electrode material, in order to arrive at one of the required ranges of the distance of the excitation center from the reflection center. In this case, the natural unidirectionality can be supplemented by a design unidirectionality. As a result, the narrowest prongs of a cell can be wider than when natural unidirectionality is absent.

It is advantageous if the substrate crystal has a triad axis of rotation. This holds true, for example, for $LiNbO_3$, $LiTaO_3$, and quartz, whereby these crystals furthermore belong to the trigonal crystal system.

The substrate can be a Y section of $LiNbO_3$, and the prong edges can be oriented perpendicular to its triad or Z axis.

The substrate crystal can also be a crystal from the langasite family, consisting of langasite ($[La_3GaGa_3(GaSi)O_{14}]$), langanite ($[La_3(Ga_{0.5}Nb_{0.5})Ga_3Ga_2O_{14}]$), langatate ([La$_3$(Ga$_{0.5}$Ta$_{0.5}$)Ga$_3$Ga$_2$O$_{14}$]), CNGS (Ca$_3$NbGa$_3$Si$_2$O$_{14}$), CTGS (Ca$_3$TaGa$_3$Si$_2$O$_{14}$) SNGS (Sr$_3$NbGa$_3$Si$_2$O$_{14}$), STGS (Sr$_3$TaGa$_3$Si$_2$O$_{14}$).

It is practical if the prongs are oriented perpendicular to the triad axis of rotation.

It is advantageous if, in the case of implementation of the electrode structure as a multi-ply layer system, the density of at least one of the electrode materials is greater than the density of aluminum and/or the phase velocity of the acoustic shear wave of one of the electrode materials, in the compact state, is less than the phase velocity of the acoustic shear wave of compact aluminum.

In advantageous manner, the electrode material can be selected from the group formed with copper, silver, gold, and platinum, whereby in the case of implementation of the electrode structure as a multi-ply layer system, at least one ply can consist of an electrode material from this group.

According to an advantageous embodiment of the invention, the prongs of the electrode structure can be buried in the substrate using pits. In this connection, the distance of the excitation center from a reflection center can be varied with the depth of the pits, without changing the structure of the transducer cells. This is also possible if the substrate or substrate and electrode structure are covered with an electrically insulating layer, whereby the prongs of the electrode structure can be buried in the layer using pits. In this connection, the prongs can be buried partially or completely in the substrate or in the layer, or the prongs can fill the pits only in part.

EXEMPLARY EMBODIMENT

In the following, the invention will be explained in greater detail using exemplary embodiments and the related drawings.

Figure 1:
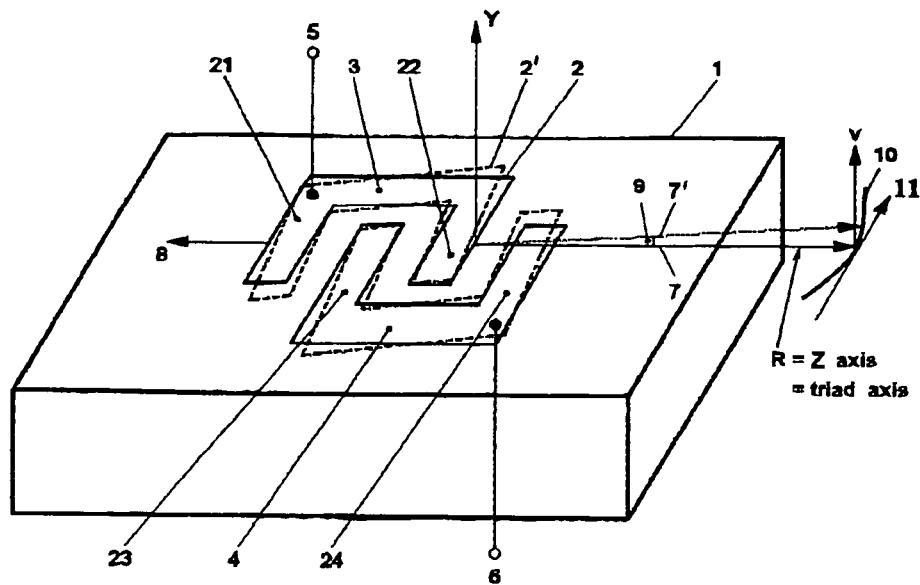
FIG. 1 shows the electrode structure of an interdigital transducer in accordance with an embodiment of the invention.

FIG. 1 shows the electrode structure of an interdigital transducer 2 on the Y section of a piezoelectric LiNbO$_3$ substrate 1 having the section normal parallel to the crystallographic Y axis of the LiNbO$_3$. The electrode structure of the interdigital transducer 2 is composed of the prongs 21, 22, 23, and 24, whereby the prongs 21 and 22 are connected with a collector electrode 3, and the prongs 23 and 24 are connected with a collector electrode 4. The prongs 21 and 23 form a transducer cell with one another, as do the prongs 22 and 24.

All the prongs 21 to 24 have the same width, and the distance between the center lines, oriented parallel to the prong edges, for example of the prongs 21 and 23, amounts to 0.5 of the quotient of the phase velocity of the surface wave and the frequency at which the transducer emits the maximal surface wave amplitude.

The transducer that is shown in FIG. 1 is shown schematically only with as many prongs as is required to explain the characteristics of the exemplary embodiment. The transducers can contain many more prongs than shown in FIG. 1.

The electrode structure consists of platinum. This material selection has the advantages that the reflection factor per transducer cell is great and the resistance of the electrode structure at high temperatures is a given. The thickness of the platinum layer amounts to 2.7% of the distance of the center lines of the prongs 21 and 22 or of the prongs 23 and 24, directed parallel to the prong axes.

The layer thickness of the electrode structure is selected in such a manner that the distance of the excitation center from a reflection center, in each transducer cell, lies between 0.115 and 0.135 or between −0.135 and −0.115 or between 0.365 and 0.385 or between −0.385 and −0.365 of the quotient of the phase velocity of the surface wave and the frequency at which the transducer emits the maximal surface wave amplitude. In order to achieve one of these distances of the excitation center from a reflection center, there are three possible platinum layer thicknesses, specifically 0.015, 0.027, and 0.048 of the wavelength, which corresponds to the quotient of the phase velocity of the surface wave and the frequency at which the transducer emits the maximal surface wave amplitude. In the present example, 0.048 of this wavelength is selected as the platinum layer thickness.

In the present case, the material of the electrode structure is predetermined. An analytical relationship between the mechanical properties of the electrode material and its layer thickness, on the one hand, and the distance of the excitation center from a reflection center, on the other hand, cannot be stated. For this reason, these calculations are only possible numerically, due to the complexity of the relationships. In this connection, the layer thickness of the electrode material is varied until the distance of the excitation center from a reflection center, calculated using a computer program, falls within one of the ranges indicated above.

During operation of the transducer 2, a high-frequency alternating voltage is applied by way of its electrical connectors 5 and 6. Although the electrode structure of the transducer 2 does not possess a preferential direction, it emits a higher surface wave amplitude in direction 7 than in the opposite direction 8, in other words the transducer has a natural unidirectionality, and the direction 7 is referred to as the forward direction.

The direction R is represented by the direction 7. The direction 7 is oriented parallel to the crystallographic Z axis of LiNbO$_3$, which is a triad axis of rotation. For this direction, $dv/d\theta=0$ applies, where v is the phase velocity of the surface wave and θ is an angle deviation of the perpendicular to the prong direction from this direction. This property is illustrated by the parabolic progression of the curve 10, which represents the dependence of the phase velocity of the surface wave on the angle 9. The angle θ corresponds to the angle 9 in FIG. 1. The abscissa axis 11, shown in FIG. 1 as an informational element, symbolizes the variation of the angle θ, which results in a variation of the phase velocity of the surface wave, expressed by the curve 10.

If the electrode structure is rotated in such a manner that the direction 7' is the forward direction, then only a slight change in the phase velocity v of the surface wave occurs, because of the evidently parabolic dependence of the phase velocity of the surface-wave on the angle 9. Thus, the frequency position of the transducer 2 is less sensitive to errors in the orientation of the electrode structure on the substrate, and the transducer 2 nevertheless demonstrates unidirectional properties.

Figure 2:
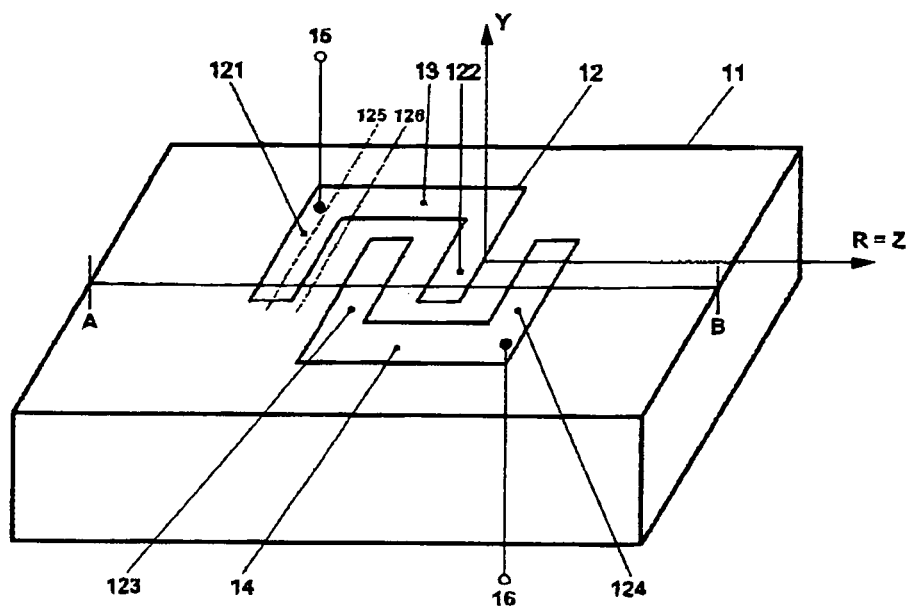
FIG. 2 shows the electrode structure of an interdigital transducer in accordance with another embodiment of the invention.

FIG. 2 shows the electrode structure of an interdigital transducer 12 on the Y section of a piezoelectric LiNbO$_3$ substrate 11 having the section normal parallel to the crystallographic Y axis of the LiNbO$_3$. The electrode structure of the interdigital transducer 12 is composed of the prongs 121, 122, 123, and 124, whereby the prongs 121 and 122 are connected with a collector electrode 13, and the prongs 123 and 124 are connected with a collector electrode 14. The prongs 121 and 123 form a transducer cell with one another, as do the prongs 122 and 124.

All the prongs 121 to 124 have the same width, and the distance between the center lines of adjacent prongs, oriented parallel to the prong edges, for example of the prongs 121 and 123, amounts to 0.5 of the quotient of the phase velocity of the surface wave and the frequency at which the transducer emits the maximal surface wave amplitude.

The transducer that is shown in FIG. 2 is shown schematically only with as many prongs as is required to explain the characteristics of the exemplary embodiment. The transducers can contain many more prongs than shown in FIG. 2.

The electrode structure consists of platinum. This material selection has the advantages that the reflection factor per transducer cell is great and the resistance of the electrode structure at high temperatures is a given. The thickness of the platinum layer amounts to 2.7% of the distance of the center lines of the prongs 121 and 122 or of the prongs 123 and 124, directed parallel to the prong edges.

The layer thickness of the electrode structure is selected in such a manner that the distance of the excitation center 125 from a reflection center 126, in each transducer cell, lies between 0.115 and 0.135 or between −0.135 and −0.115 or between 0.365 and 0.385 or between −0.385 and −0.365 of the quotient of the phase velocity of the surface wave and the frequency at which the transducer emits the maximal surface wave amplitude.

In the present case, the material of the electrode structure is predetermined. An analytical relationship between the mechanical properties of the electrode material and its layer thickness, on the one hand, and the distance of the excitation center from a reflection center, on the other hand, cannot be stated. For this reason, these calculations are only possible numerically, due to the complexity of the relationships. In this connection, the layer thickness of the electrode material is varied until the distance of the excitation center from a reflection center, calculated using a computer program, falls within one of the ranges indicated above.

During operation of the transducer 12, a high-frequency alternating voltage is applied by way of its electrical connectors 15 and 16. Although the electrode structure of the transducer 12 does not possess a preferential direction, it emits a higher surface wave amplitude in direction R than in the opposite direction, in other words the transducer 12 has a natural unidirectionality. The direction R is simultaneously the direction of the crystallographic Z axis of the LiNbO$_3$.

Figure 3:
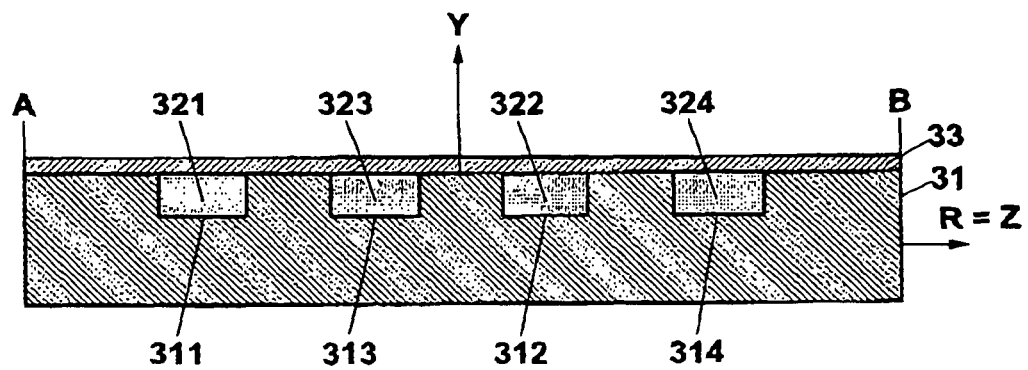
FIG. 3 shows a section through an interdigital structure along a line from A to B shown in FIG. 2 with completely buried prongs covered with an electrically insulating layer.

FIG. 3 shows a section through an interdigital structure on the Y section of a piezoelectric LiNbO$_3$ substrate 31 with completely buried prongs. This section is carried out along a line from A to B, shown in FIG. 2. The section plane is spanned by the crystallographic Y axis and the crystallographic Z axis, which is simultaneously the direction R and a triad axis of rotation. The interdigital structure contains the prongs 321, 322, 323, and 324, which are completely buried in the pits 311, 313, 312, and 314, whereby the pits 311, 313, 312, and 314 are completely filled. The buried transducer structure is covered with an electrically insulating layer 33.

The transducer, the prongs 321, 322, 323, and 324 of which are contained in FIG. 3, is shown schematically only with as many prongs as required to explain the characteristics of the exemplary embodiment. The transducers can contain many more prongs than shown in FIG. 3.

Figure 4:
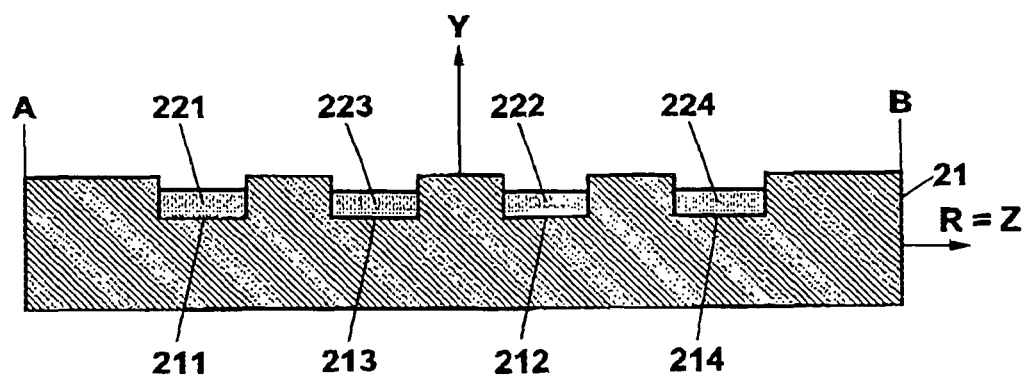
FIG. 4 shows a section through an interdigital structure along a line from A to B shown in FIG. 2 with buried prongs wherein the pits are incompletely filled.

FIG. 4 shows a section through an interdigital structure on the Y section of a piezoelectric LiNbO$_3$ substrate 21 with buried prongs. This section is carried out along a line from A to B, shown in FIG. 2. The section plane is spanned by the crystallographic Y axis and the crystallographic Z axis, which is simultaneously the direction R and a triad axis of rotation. The interdigital structure contains the prongs 221, 222, 223, and 224, which are buried in the pits 211, 213, 212, and 214, whereby the pits 211, 213, 212, and 214 are incompletely filled.

The transducer, the prongs 221, 222, 223, and 224 of which are contained in FIG. 4, is shown schematically only with as many prongs as required to explain the characteristics of the exemplary embodiment. The transducers can contain many more prongs than shown in FIG. 4.

Figure 5:
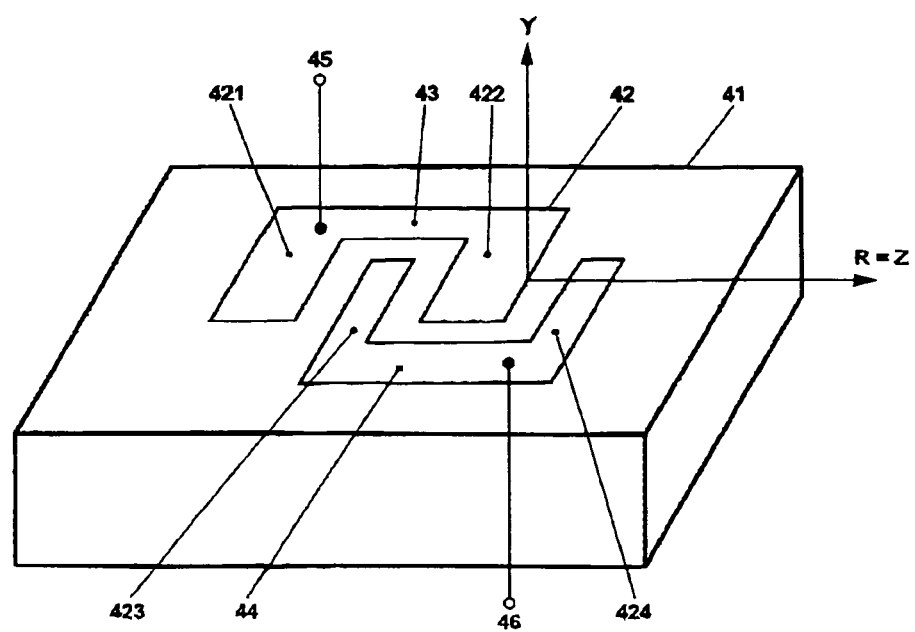
FIG. 5 shows the electrode structure of an interdigital transducer in accordance with a further embodiment of the invention.

FIG. 5 shows the electrode structure of an interdigital transducer 42 on the Y section of a piezoelectric LiNbO$_3$ substrate 41 having the section normal parallel to the crystallographic Y axis of the LiNbO$_3$. The electrode structure of the interdigital transducer 42 is composed of the prongs 421, 422, 423, and 424, whereby the prongs 421 and 422 are connected with a collector electrode 43, and the prongs 423 and 424 are connected with a collector electrode 44. The prongs 421 and 423 form a transducer cell with one another, as do the prongs 422 and 424.

The prongs 421 and 422, which are connected to the collector electrode 43, have the same width but are wider than the prongs 423 and 424, which are connected to the collector electrode 44, and also have the same width.

The transducer contained in FIG. 5 is shown schematically only with as many prongs as required to explain the characteristics of the exemplary embodiment. The transducers can contain many more prongs than shown in FIG. 5.

The layer thickness of the electrode structure is selected in such a manner that the distance of the excitation center from a reflection center, in each transducer cell, lies between 0.115 and 0.135 or between −0.135 and −0.115 or between 0.365 and 0.385 or between −0.385 and −0.365 of the quotient of the phase velocity of the surface wave and the frequency at which the transducer emits the maximal surface wave amplitude.

During operation of the transducer 42, a high-frequency alternating voltage is applied by way of its electrical connectors 45 and 46.

The direction R is directed parallel to the crystallographic Z axis of LiNbO$_3$, which is a triad axis of rotation.

| Reference Symbol List | |
|---|---|
| 1 | piezoelectric substrate |
| 2, 2' | interdigital transducer |
| 21, 22, 23, 24 | prongs |
| 3, 4 | collector electrodes |
| 5, 6 | connectors |
| 7, 7' | direction/forward direction |
| 8 | direction |
| 9 | angle |
| 10 | curve |
| 11 | abscissa axis |

The invention claimed is:

1. Transducer having natural unidirectionality for surface acoustic waves, in which the interdigital electrode structure is disposed on a piezoelectric crystal substrate (1) that is built up from interdigital transducers (2) that consist of collector electrodes (3; 4) and prongs (21; 22; 23; 24), whereby at least two of the prongs (21; 23) (22; 24) form a transducer cell that has at least one excitation center for exciting an electrical potential wave and at least one reflection center for reflecting electrical potential waves, wherein
   a) the prongs (21; 22; 23; 24) are oriented perpendicular to a direction R, whereby the direction R is directed parallel to a monad or triad axis of rotation of the substrate crystal, and wherein
   b) the derivation $dv/d\theta=0$ holds true for the direction R, where v is the phase velocity of the surface wave and $\theta$ is an angle deviation of the perpendicular to the prong direction from this direction R, whereby, however, the directions perpendicular to the mirror plane of the substrate crystal are excepted,
      and whereby the crystal substrate surfaces parallel to a mirror plane of the substrate crystal are excepted, for the arrangement of the interdigital electrode structure.

2. Transducer having natural unidirectionality according to claim 1, wherein the electrode structure is structured as a mono-ply or as a multi-ply layer system.

3. Transducer having natural unidirectionality according to claim 1, wherein a transducer cell contains two prongs having the same width and different polarity, where the distance between the prong centers amounts to 0.5 of the quotient of the phase velocity of the surface wave and the frequency at which the transducer emits the maximal surface wave amplitude.

4. Transducer having natural unidirectionality according to claim 1, wherein a transducer cell contains two prongs having different widths, if the electrode materials and their layer thicknesses are selected in such a manner that in a transducer cell that contains two prongs having the same width and different polarity, the distance between the prong centers of which amounts to 0.5 of the quotient of the phase velocity of the surface wave and the frequency at which the transducer emits the maximal surface wave amplitude, the distance of the excitation center from a reflection center lies outside of the ranges 0.115 to 0.135 and −0.135 to −0.115 and 0.365 to 0.385 and −0.385 to −0.365 of the quotient of the phase velocity of the surface wave and the frequency at which the transducer emits the maximal surface wave amplitude.

5. Transducer having natural unidirectionality according to claim 1, wherein the substrate crystal belongs to the trigonal crystal system.

6. Transducer having natural unidirectionality according to claim 5, wherein the substrate crystal is $LiNbO_3$, $LiTaO_3$, quartz, or a crystal from the langasite family, consisting of langasite ($[La_3\ Ga\ Ga_3\ (GaSi)\ O_{14}]$), langanite ($[La_3(Ga_{0.5}Nb_{0.5})\ Ga_3\ Ga_2\ O_{14}]$), langatate ($[La_3(Ga_{0.5}Ta_{0.5})\ Ga_3\ Ga_2O_{14}]$), CNGS ($Ca_3NbGa_3Si_2O_{14}$), CTGS ($Ca_3TaGa_3Si_2O_{14}$), SNGS ($Sr_3NbGa_3Si_2O_{14}$), or STGS ($Sr_3TaGa_3Si_2O_{14}$).

7. Transducer having natural unidirectionality according to claim 6, wherein the piezoelectric crystal substrate is a Y section of $LiNbO_3$ and the prong edges are oriented perpendicular to its triad or Z axis.

8. Transducer having natural unidirectionality according to claim 2, wherein in the case of implementation of the electrode structure as a multi-ply layer system, the density of at least one of the electrode materials is greater than the density of aluminum.

9. Transducer having natural unidirectionality according to claim 2, wherein in the case of implementation of the electrode structure as a multi-ply layer system, the phase velocity of the acoustic shear wave of one of the electrode materials, in the compact state, is less than the phase velocity of the acoustic shear wave of compact aluminum.

10. Transducer having natural unidirectionality according to claim 1, wherein the electrode material is selected from the group formed with copper, silver, gold, and platinum, whereby in the case of implementation of the electrode structure as a multi-ply layer system, at least one ply consists of an electrode material from this group.

11. Transducer having natural unidirectionality according to claim 1, wherein the substrate or substrate and electrode structure are covered with an electrically insulating layer.

12. Transducer having natural unidirectionality according to claim 1, wherein the prongs of the electrode structure are partially or completely buried in the substrate and/or in the electrically insulating layer, in pits, whereby the prongs fill the pits completely or only in part.

* * * * *